(12) United States Patent
Narayanan

(10) Patent No.: US 6,943,060 B1
(45) Date of Patent: Sep. 13, 2005

(54) METHOD FOR FABRICATING INTEGRATED CIRCUIT PACKAGE WITH SOLDER BUMPS

(75) Inventor: Kollengode Subramanian Narayanan, Cupertino, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 10/794,945

(22) Filed: Mar. 5, 2004

Related U.S. Application Data

(62) Division of application No. 10/323,963, filed on Dec. 18, 2002, now Pat. No. 6,750,552.

(51) Int. Cl.⁷ .......................................... H01L 23/488
(52) U.S. Cl. ........................ 438/108; 29/832; 29/840
(58) Field of Search .................... 438/106, 108, 438/125, 126; 29/832, 840, 841; 228/180.21, 228/180.22; 257/692, 693, 697, 706, 707, 257/737, 738, 773, 777, 778, 780, 786

(56) References Cited

U.S. PATENT DOCUMENTS

| | | | | |
|---|---|---|---|---|
| 5,400,950 A | * | 3/1995 | Myers et al. | 228/180.22 |
| 5,677,575 A | * | 10/1997 | Maeta et al. | 257/778 |
| 5,726,491 A | * | 3/1998 | Tajima et al. | 358/1.18 |
| 5,744,859 A | * | 4/1998 | Ouchida | 257/668 |
| 6,462,420 B2 | * | 10/2002 | Hikita et al. | 257/777 |
| 6,677,677 B2 | * | 1/2004 | Kimura et al. | 257/737 |
| 6,724,078 B1 | * | 4/2004 | Sur et al. | 257/704 |
| 2001/0009302 A1 | * | 7/2001 | Murayama et al. | 257/704 |

FOREIGN PATENT DOCUMENTS

| | | | | | |
|---|---|---|---|---|---|
| JP | 01-238148 A | * | 9/1989 | | H01L 21/92 |
| JP | 01238148 A | * | 9/1989 | | H01L 21/92 |

\* cited by examiner

*Primary Examiner*—John B. Vigushin
(74) *Attorney, Agent, or Firm*—Shemwell Gregory & Courtney LLP

(57) ABSTRACT

A semiconductor package with solder bumps and a method for making the same are described. One embodiment comprises a flip-chip design with a rectangular semiconductor die with a relatively large aspect ratio bonded to a substantially square substrate through solder bumps. In one embodiment, active bumps are concentrated in an area relatively close to the neutral point of the die, for example, in a substantially square area about the neutral point.

25 Claims, 6 Drawing Sheets

METHOD FOR FABRICATING INTEGRATED CIRCUIT PACKAGE WITH SOLDER BUMPS

RELATED APPLICATIONS

This patent application is a divisional application of U.S. patent application Ser. No. 10/323,963, filed Dec. 18, 2002 now U.S. Pat. No. 6,750,552.

FIELD OF THE INVENTION

The present invention relates to semiconductor packaging, in particular semiconductor packaging techniques using solder bumps or studs.

BACKGROUND

Evolving end-use applications for electronic components dictate smaller and faster, yet reliable components. Cellular phones, video cameras, laptop computers and personal digital assistants are examples of products that are more attractive if they are smaller, yet have superior performance and reliability. These end-use applications require semiconductor chips, or integrated circuit ("IC") packages, that have reduced size and increased input/output ("I/O") density. To be acceptable for most end-use applications, these chips must also have a reasonably long life in conditions that include thermal cycling in a close environment and shock, such as from accidental dropping. Traditional wirebond technologies do not provide the size, electrical performance, and reliability required by most modern high performance ICs. Several alternatives to wirebond technology have been developed to respond to the challenges presented by modern electronic end-use applications. For example, flip-chip technology positions the semiconductor die (typically formed on a silicon base) on top of the substrate and bonds the die to the substrate with a series of solder bumps or alternatively, studs. The solder bumps typically include both "active" and "dummy" bumps. Active bumps serve as signal paths for the IC. Dummy bumps are for mechanical bonding.

Similar technologies to flip-chip packages are ball grid array packages and chip scale packages ("CSPs"), all of which place the die on top of the substrate. Typically, these packages are attractive because they allow high I/O density and have good heat dissipation characteristics. One requirement for reliability is that the solder bumps maintain the bond between the die and the substrate. If active bumps break, the IC can fail. If a dummy bump fails, mechanical instability can be introduced, eventually leading to other failures. The likelihood of bump failure increases as the distance from the center point of the die known as the distance from the neutral point, or "DNP") increases. The relationship between the size of the die and the size of the substrate also affects IC life. For example, for the same die size, the number of temperature cycles before failure is greater for relatively larger substrates. The IC design process, therefore, takes into consideration the aspect ratio of the die, the placement of both active and dummy bumps, and the relative sizes of the die and the substrate.

Typical IC packages using dummy bumps have die with low aspect ratios. For example, for a common flip-chip package, the maximum ratio of die length to die width (i.e., the aspect ratio) is marginally greater than 1.0 and less than 1.3. For some applications, however, die with significantly higher die aspect ratios are desired or required. As die aspect ratio increases for a fixed die surface area, DNP increases even though surface area does not. FIG. 1 illustrates this by showing a hypothetical die 102 and a hypothetical die 104 with identical surface areas. Die 102 has an aspect ratio of 1, while die 104 has an aspect ratio of 4. The die 102 has an approximate maximum DNP 103. The die 104 has an approximate maximum DNP 105. It is evident that the DNP 105 (approximately 2.1) is greater than the DNP 103 (approximately 1.4). Current design practices may be inadequate to produce a reliable IC given a die with a relatively high aspect ratio. For example, merely trying to place active bumps further from the periphery of the die may still place active bumps on the long axis of the die with a DNP that is too great to guarantee acceptable reliability.

Thus, there is a need for an integrated circuit semiconductor package and a method for fabricating the same that provides acceptable performance and reliability given a semiconductor die with a relatively high aspect ratio.

BRIEF DESCRIPTION OF THE DRAWINGS

The present invention is illustrated by way of example, and not by way of limitation, in the figures of the accompanying drawings in which.

DETAILED DESCRIPTION

A semiconductor package with solder bumps and a method for making the same are described. One embodiment comprises a flip-chip design with a rectangular semiconductor die bonded to a substrate through solder bumps. In one embodiment, active bumps are concentrated in an area relatively close to the neutral point of the die, for example, in a substantially square area about the neutral point.

Figure 1:
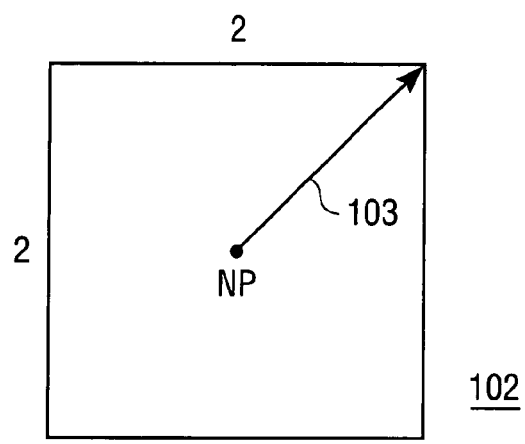
FIG. 1 is a diagram of two hypothetical die with different aspect ratios.
Figure 1:
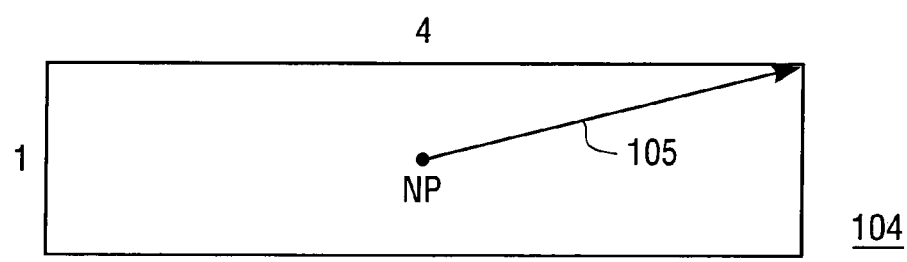
Figure 2A:
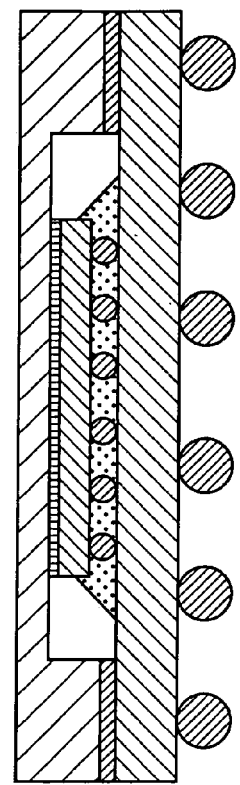
FIGS. 2a–2d are block diagrams illustrating an assembly process for one embodiment of a semiconductor package.

FIGS. 2a–2d are block diagrams illustrating an assembly process for one embodiment of a semiconductor package ("package"). FIG. 2a shows a die 202, solder bumps 204 and a substrate 206. The die 202 is shown after a bumping process that attaches solder bumps 204 to one surface of the die 202. Various bumping processes are known in the art, and any known bumping process may be used. In general, the bumping process causes solder bumps to adhere to a surface of the die using heat. Various types of solder bumps can be used. For example, eutectic bumps or high-lead content bumps can be used. In one example, eutectic bumps have a composition of approximately 67% Pb and 33% Sn. In one example, high-lead bumps have a composition of approximately 90–97% Pb and 3–10% Sn. Eutectic bumps and high-lead bumps each have advantages and disadvantages that must be taken into consideration when designing a package. The assembly temperature is lower for eutectic bumps than for high-lead bumps, which may reduce the stress introduced by heating during assembly. Either plating or printing can be used in the eutectic bumping process, while plating is generally preferable for high-lead bumping. High-lead bumping is often preferred for larger die. High-lead solder resists flowing into cracks under standard printed circuit board ("PCB") board reflow conditions, which might cause shorting between bumps. Substrates can be used with a presolder material to lower the bonding temperatures of the assembly process for high-lead bumps. High-lead solder, however, requires higher reflow and assembly temperatures than eutectic solder, and is prone to oxidation.

Figure 2B:
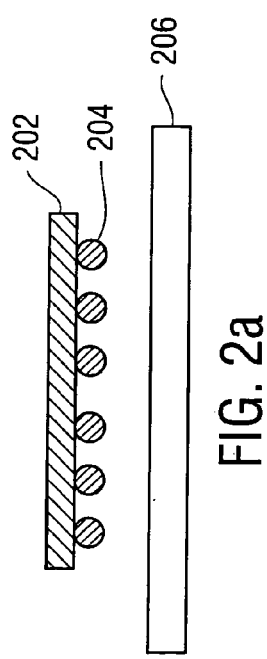
Figure 2C:
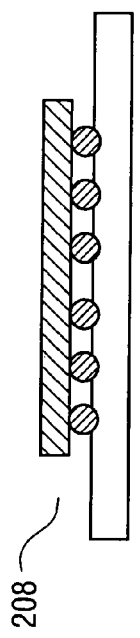
Figure 2D:
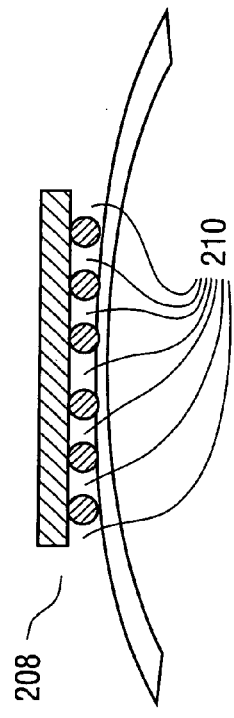

The semiconductor die 202 is bonded to an organic substrate 206 to produce a subassembly 208, which is shown in FIG. 2b. The subassembly 208 can experience warpage during the thermal bonding process, as shown in FIG. 2c. The warpage is exaggerated in the figure. Bonding of the dissimilar materials is done using heat in various processes known in the art. The gaps between the die 202 and the substrate 206 are often underfilled with an underfill material 210, as show in FIG. 2c. The underfill material is made to flow around the bumps 204. Some packages, such as chip size packages ("CSPs") may or may not be underfilled. Underfill has been found to improve package life, however, even in CSPs. Underfill acts as a kind of shock absorber to reduce actual movement of the die 202, the bumps 204, and the substrate 206 relative to each other due to heat cycling or shock. In the absence of underfill, breakage (e.g., separation of bumps from the die or from the substrate) usually occurs after fewer thermal cycles. Bump separation can cause device failure, especially when the separated bump was used to carry a non-redundant or critical signal. Redundant or non-critical signals may include power and ground signals, or signals that are not used during the normal operation of the device. Critical signals generally include data, address and/or control signals, or other input, output, or input/output signals. Another part of the assembly process is attachment of a heat dissipating and protective lid to produce an assembly 300, as shown in FIG. 2d. The assembly 300 is further illustrated in FIG. 3.

Figure 3:
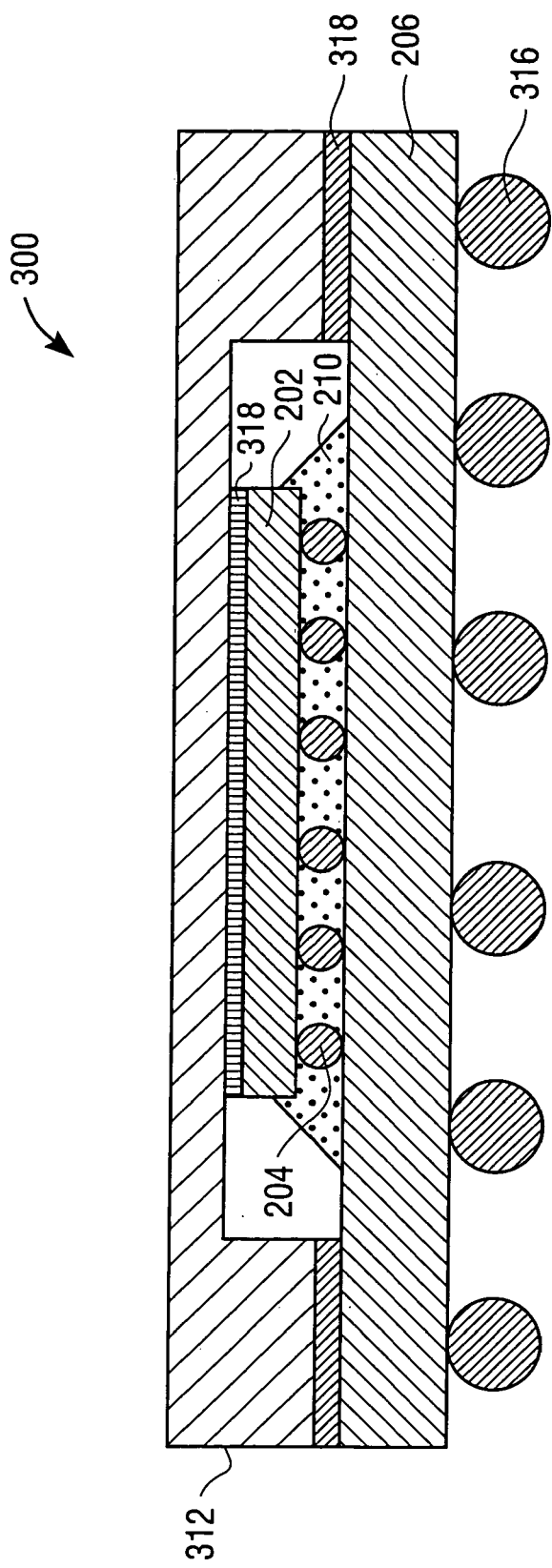
FIG. 3 is a diagram of an embodiment of an IC package.

FIG. 3 shows a cross section of the assembly 300, including semiconductor die 202, bumps 204, substrate 206, and underfill 210. Underfill 210 is shown surrounding the area between the die 202 and the substrate 206 around the bumps 204. Substrate 206 includes conductive traces (not shown) on one or more layers that electrically interconnect one or more bumps 204 to one or more balls 316. Balls 316 form a ball grid array ("BGA") on a surface of the substrate 206 opposite the surface that is bonded to the die 202 through the bumps 204. BGAs are known in the art. Generally, a BGA joint is a bead of solder between two circular pads. Arrays of these joints are used to mount packages on printed circuit boards.

FIG. 3 further includes a typical heat dissipating lid 312 bonded to the surface of die 202 opposite the surface that is bumped. The lid 312 is bonded with a lid attach material 318. In some embodiments, as shown in FIG. 3, the lid 312 is also bonded to the substrate 206 with a lid attach material 318. In other embodiments, the lid 312 is not attached to the substrate. The materials for the assembly 300 have different chemical and physical characteristics. For example, various materials have different coefficients of thermal expansion ("CTE"). For example, the lid 312 may be designed to have a relatively high CTE of 10–17 (all CTE values given are in ppm/degrees Kelvin), to serve as a heat spreader. Exemplary CTE's for other materials may include: 3 for the die 202; 15–17 for the substrate 206; 28 for high-lead solder bumps 204; 23 for eutectic solder bumps 204, 32 or 38 for underfill 210; and 46 for lid attach material 318. The different characteristics of the various materials, including CTE, cause the various materials to react to stresses (e.g., heat and mechanically induced stress) differently.

15. This poses a challenge in designing a package that will withstand normal operational stresses for an expected lifetime. One of the potential failure points of the assembly 300 is the bond between the die 202 and the substrate 206. Bumps can fail when stresses distort the assembly. This effect is exaggerated toward the outer edges of the die surface. Bumps closer to the center of mass (neutral point) of the die are less prone to failure.

It has been shown that reliability decreases as the size of the die approaches the size of the substrate especially for larger packages. It has also been shown that warpage (such as that seen in assembly 208 of FIG. 2c) increases with package size and as die size increases for a given package size, assembly process and material set. This is at least partly a consequence of the thermal mismatch between the die (e.g., a CTE of about 3) and the organic substrate (e.g., a CTE of about 15–17). Therefore, it is generally desirable to have a large substrate 206 relative to the die 202, if possible. The substrate 206 is typically square, while the die 202 is often not square.

Another general guideline is that the stress experienced by bumps, also called bump strain, is inversely proportional to bump height. For example, for larger die, a bump height of greater than 100 micron may be desirable. The bump pitch, or the distance between bump centers, typically should be small enough to provide appropriate electrical and mechanical bonding of the die to the substrate, but not so small as to constrict the flow of underfill around the bumps.

Figure 4:
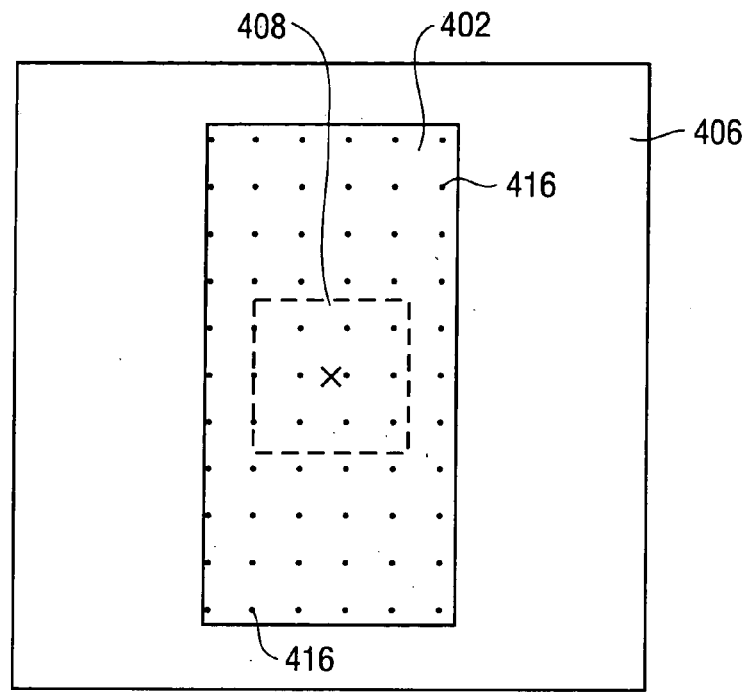
FIG. 4 is a diagram of an embodiment of a silicon die after undergoing a bumping process.

FIG. 4 is a top view of a die 402. The die 402 is one embodiment of the die 202 that can be assembled in the assembly 300. FIG. 4 shows the die 402, a substrate 406 and an approximately square area 408 around a neutral point (marked by "X") in the middle of the die 402. FIG. 4 is not to scale, but relative dimensions illustrate the embodiment. The die 402 has a relatively large aspect ratio and is bonded to the relatively square substrate 406. In one embodiment, the substrate 406 is a 27 mm square substrate, and the die 406 is approximately 11.4 mm×14.9 mm. In other embodiments, the aspect ratio of the die 406 is approximately 2. The matrix of dots 416 shown on the die 402 are locations of bumps. The bumps themselves are on the surface of the die 402 that faces the substrate 406, i.e., the die is transparent in FIG. 4 to show the locations of the bumps. The area 408 includes locations of critical bumps, while the area of the die 402 excluded by the area 408 includes locations of non-critical or redundant bumps. Placing critical bumps closer to the neutral point increases reliability of the eventual package. In one embodiment, the bump pitch is between approximately 230 micron and approximately 300 micron. The bump locations shown by dots are not to scale, but their positions relative to each other indicate the regular pattern of bump locations in one embodiment. That is, bump pitches are uniform over the die 402. In other embodiments, the bumps may be arranged in various other regular or irregular patterns. For example, the bumps in area 408 and/or outside of area 408 may each have one or more different pitches with respect to each other (i.e., a non-regular or non-matrix pattern). FIGS. 5–8 show a variety of alternative bump arrangements.

Figure 5:
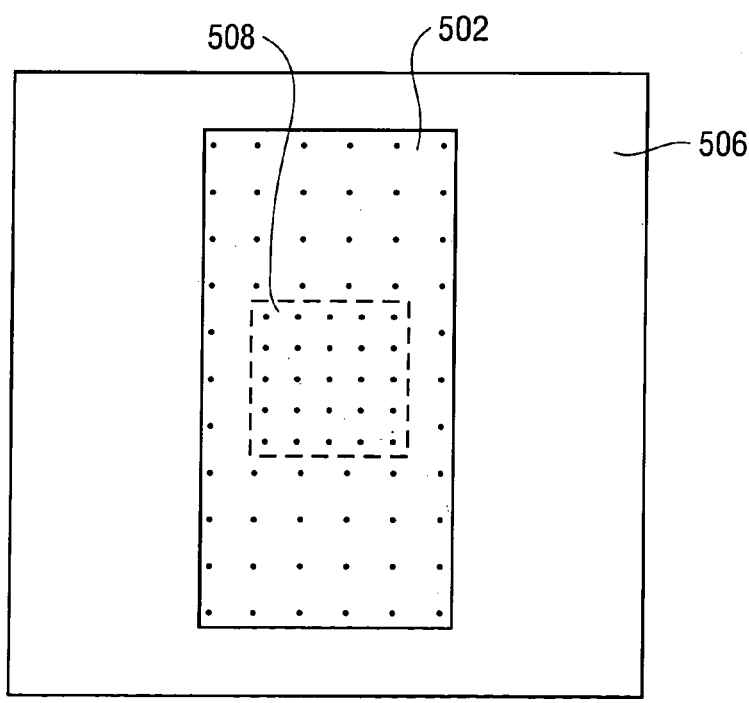
FIG. 5 is a diagram of an embodiment of a silicon die after undergoing a bumping process.

FIG. 5 is a diagram of an embodiment of a die 502. The area 508 includes locations of critical bumps, while the area of the die 502 excluded by the area 508 includes locations of non-critical or redundant bumps. Placing critical bumps closer to the neutral point increases reliability of the eventual package. In one embodiment, the bump pitch is variable between approximately 230 micron and approximately 300 micron. The bump locations shown by dots are not to scale, but their positions relative to each other indicate the regular pattern of bump locations in one embodiment. That is, bump pitches in the area 508 are smaller relative to the bump pitches in the area excluded by the area 508. In one embodiment, bump pitches in the area 508 are approximately 230 micron, and the bump pitches outside the area 508 are approximately 300 micron.

Figure 6:
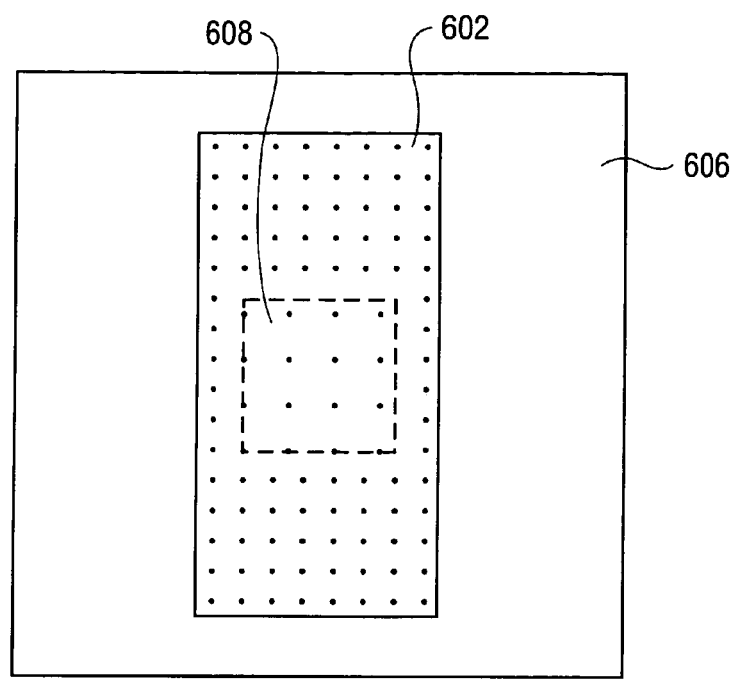
FIG. 6 is a diagram of an embodiment of a silicon die after undergoing a bumping process.

FIG. 6 is a diagram of an embodiment of a die 602. The area 608 includes locations of critical bumps, while the area of the die 602 excluded by the area 608 includes locations of non-critical or redundant bumps. In one embodiment, the bump pitch is variable between approximately 230 micron and approximately 300 micron. The bump locations shown by dots are not to scale, but their positions relative to each other indicate the regular pattern of bump locations in one embodiment. That is, bump pitches in the area 608 are larger relative to the bump pitches in the area excluded by the area 608. In one embodiment, bump pitches in the area 608 are approximately 300 micron, and the bump pitches outside the area 608 are approximately 230 micron.

Figure 7:
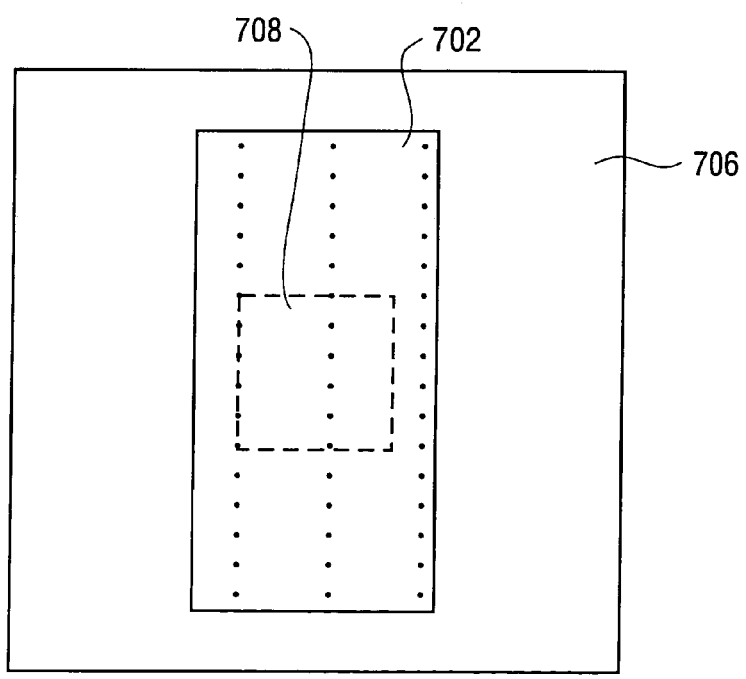
FIG. 7 is a diagram of an embodiment of a silicon die after undergoing a bumping process.

FIG. 7 is a diagram of an embodiment of a die 702. The area 708 includes locations of critical bumps, while the area of the die 702 excluded by the area 708 includes locations of non-critical or redundant bumps. Not placing critical bumps along the outer edges of the die improves reliability. In one embodiment, the bump pitch is variable between approximately 230 micron and approximately 300 micron. The bump locations shown by dots are not to scale, but their positions relative to each other indicate the regular pattern of bump locations in one embodiment. That is, bump pitches along the longer axis of the die 702 are smaller than the bump pitches along the shorter axis of the die 702. In one embodiment, the bump pitches along the longer axis of the die 702 are approximately 230 micron, and the bump pitches along the shorter axis of the die 702 are approximately 300 micron.

Figure 8:
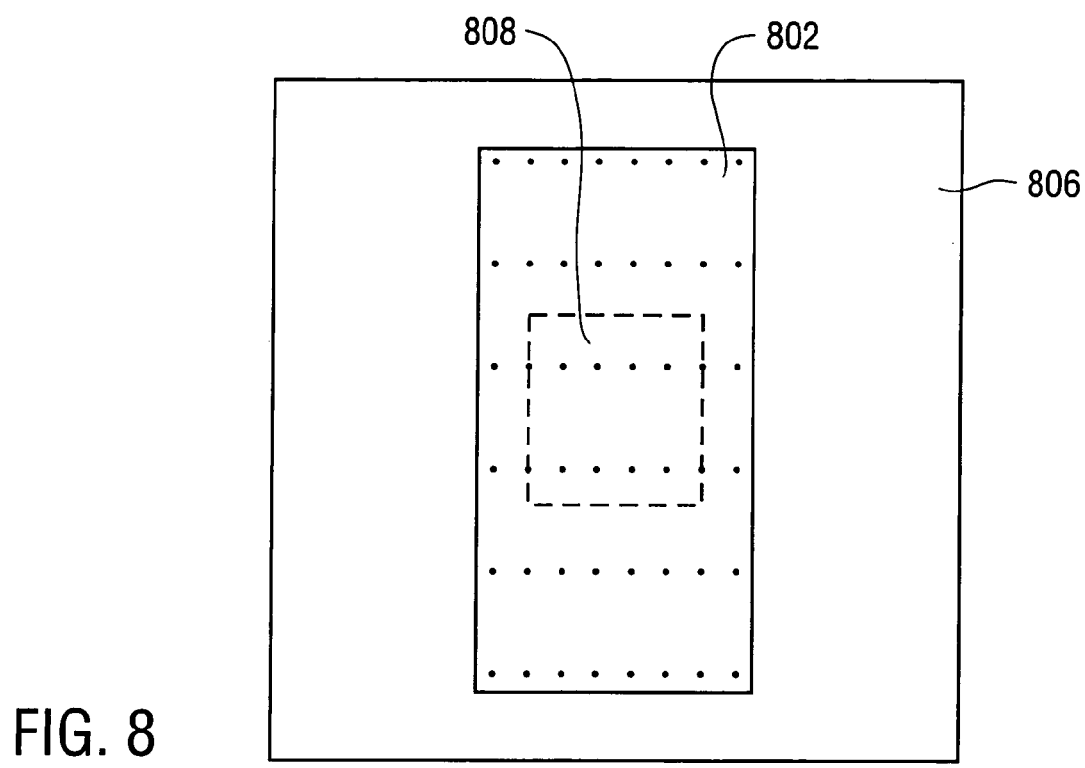
FIG. 8 is a diagram of an embodiment of a silicon die after undergoing a bumping process.

FIG. 8 is a diagram of an embodiment of a die 802. The area 808 includes locations of critical bumps, while the area of the die 802 excluded by the area 808 includes locations of non-critical or redundant bumps. In one embodiment, the bump pitch is variable between approximately 230 micron and approximately 300 micron. The bump locations shown by dots are not to scale, but their positions relative to each other indicate the regular pattern of bump locations in one embodiment. That is, bump pitches along the longer axis of the die 802 are larger than the bump pitches along the shorter axis of the die 802. In one embodiment, the bump pitches along the longer axis of the die 802 are approximately 300 micron, and the bump pitches along the shorter axis of the die 802 are approximately 230 micron.

Although the invention has been described with reference to specific exemplary embodiments thereof, various modifications and changes may be made thereto without departing from the broader spirit and scope of the invention as set forth in the appended claims. For example, alternative embodiments include studs instead of bumps. Other alternative embodiments include non-uniform bump or stud distribution and different bump pitches than those described. The specification and drawings are, accordingly, to be regarded in an illustrative rather than a restrictive sense.

What is claimed is:

1. A method for fabricating an integrated circuit ("IC") package, comprising:
  applying bumps to a semiconductor die, wherein the die has an aspect ratio greater than 1.3, wherein applying bumps comprises,
    applying active bumps to a first region of a surface of the die, wherein the first region includes a substantially square area about a neutral point of the die; and
    applying non-active bumps to a second region of the die, wherein the second region includes the surface of the die that is not part of the first region; and
  bonding the die to a substrate though the bumps.

2. The method of claim 1, wherein active bumps carry signals that are not redundant.

3. The method of claim 2, wherein the non-active bumps include bumps that carry redundant signals and bumps that carry no signals.

4. The method of claim 1, wherein:
  there is a first pitch between adjacent bump centers in the first region; and
  there is a second pitch between adjacent bump centers in the second region.

5. The method of claim 4, wherein the first pitch and the second pitch are the same.

6. The method of claim 4, wherein the first pitch is greater than the second pitch.

7. The method of claim 4, wherein the second pitch is greater than the first pitch.

8. The method of claim 1, wherein:
  there is a first pitch between adjacent bump centers along one axis of the die; and
  there is a second pitch between adjacent bump centers along another axis of the die.

9. The method of claim 8, wherein:
  the first pitch is approximately 230 micron; and
  the second pitch is approximately 300 micron.

10. The method of claim 9, wherein:
  the first pitch is along a longer axis of the die; and
  the second pitch is along a shorter axis of the die.

11. The method of claim 1, wherein the aspect ratio is approximately 2.

12. The method of claim 1, further comprising applying an underfill material around the bumps between the die and the substrate.

13. The method of claim 1, wherein the substrate comprises a ball grid array.

14. The method of claim 1, further comprising coupling a heat dissipating lid to a surface of the die opposite the surface on which the bumps are arranged.

15. A method for fabricating an integrated circuit ("IC") package, comprising:
  a semiconductor die having an aspect ratio greater than 1.3; and
  attaching a plurality of solder bumps to a surface of a semiconductor die, comprising,
    attaching active bumps arranged regularly on a first region of the surface, wherein the active bumps carry non-redundant signal, and wherein the first region comprises a substantially square area about a neutral point of the surface of the die; and
    attaching non-active bumps regularly about the first region, wherein the non-active bumps include bumps that carry redundant signals and bumps that carry no signals, wherein the semiconductor die has an aspect ratio greater than 1.3.

16. The method of claim 15, further comprising:
  coupling a substrate to the die through the plurality of solder bumps, wherein the substrate comprises a ball grid array;

applying an underfill layer such that the underfill layer surrounds the plurality of bumps and is coupled to the die and the substrate; and coupling a lid with heat dissipating characteristics to a surface of the die opposite the surface on which the plurality of solder bumps are arranged.

17. The method of claim 15, further comprising arranging the active bumps regularly with a first pitch, and arranging the non-active bumps regularly with a second pitch.

18. The method of claim 17, wherein the first pitch and the second pitch are the same.

19. The method of claim 17, wherein the first pitch is greater than the second pitch.

20. The method of claim 17, wherein the second pitch is greater than the first pitch.

21. The method of claim 20, further comprising arranging the plurality of solder bumps regularly on the surface such that there is a first pitch between solder bumps along one axis of the die, and a second pitch between solder bumps along another axis of the die.

22. The method of claim 20, wherein the first pitch is approximately 230 microns, and the second pitch is approximately 300 microns.

23. The method of claim 22, wherein the first pitch is along a longer axis of the die, and the second pitch is along a shorter axis of the die.

24. The method of claim 22, wherein the first pitch is along a shorter axis of the die, and the second pitch is along a longer axis of the die.

25. The method of claim 15, wherein the aspect ratio is approximately 2.

* * * * *